United States Patent
Lucat et al.

(10) Patent No.: US 8,287,943 B2
(45) Date of Patent: Oct. 16, 2012

(54) METHOD FOR PRODUCING A MULTILAYER PIEZOELECTRIC MICROCOMPONENT USING SACRIFICIAL THICK FILM TECHNOLOGY

(75) Inventors: Claude Lucat, Cestas (FR); Francis Menil, Saint-Selve (FR); Hélène Debeda-Hickel, Gradignan (FR); Patrick Ginet, Bordeaux (FR)

(73) Assignee: Centre National de la Recherche Scientifique, Paris (FR)

( * ) Notice: Subject to any disclaimer, the term of this patent is extended or adjusted under 35 U.S.C. 154(b) by 949 days.

(21) Appl. No.: 12/160,179

(22) PCT Filed: Jan. 5, 2007

(86) PCT No.: PCT/FR2007/000013
§ 371 (c)(1),
(2), (4) Date: Nov. 10, 2008

(87) PCT Pub. No.: WO2007/077397
PCT Pub. Date: Jul. 12, 2007

(65) Prior Publication Data
US 2009/0197061 A1    Aug. 6, 2009

(30) Foreign Application Priority Data
Jan. 6, 2006  (FR) ................................ 06 00124

(51) Int. Cl.
*B05D 5/12* (2006.01)
*H01L 41/22* (2006.01)
*H01L 21/00* (2006.01)
*H01L 41/00* (2006.01)
*B32B 3/00* (2006.01)

(52) U.S. Cl. ........... 427/100; 427/58; 427/77; 427/96.1; 427/97.1; 427/97.3; 427/97.4; 427/97.5; 427/97.6; 427/98.4; 427/99.2; 427/99.4; 427/123; 427/125; 427/126.1; 427/126.5; 438/52; 310/311; 29/25.35; 257/E27.006; 428/209

(58) Field of Classification Search ............ 427/58, 427/96.1, 99.2, 99.4, 77, 97.1, 97.3, 97.4, 427/97.5, 97.6, 98.4, 100, 126, 125, 126.1, 427/126.5; 205/80, 109, 128, 183; 438/52; 310/311; 29/25.35; 428/209; 257/E27.006
See application file for complete search history.

(56) References Cited

U.S. PATENT DOCUMENTS
5,846,396 A * 12/1998 Zanzucchi et al. ............ 506/33
(Continued)

FOREIGN PATENT DOCUMENTS
WO    WO 2005008889 A1 *  1/2005

OTHER PUBLICATIONS
International Search Report dated Jun. 20, 2007 (Two pages).
(Continued)

*Primary Examiner* — Christina Johnson
*Assistant Examiner* — Atul P Khare
(74) *Attorney, Agent, or Firm* — Merchant & Gould

(57) ABSTRACT

The invention relates to the preparation of multilayer microcomponents which comprise one or more films, each consisting of a material M selected from metals, metal alloys, glasses, ceramics and glass-ceramics.

The method consists in depositing on a substrate one or more films of an ink P, and one or more films of an ink M, each film being deposited in a predefined pattern selected according to the structure of the microcomponent, each film of ink P and each film of ink M being at least partially consolidated before deposition of the next film; effecting a total consolidation of the films of ink M partially consolidated after their deposition, to convert them to films of material M; totally or partially removing the material of each of the films of ink P. An ink P consists of a thermoset resin containing a mineral filler or a mixture comprising a mineral filler and an organic binder. An ink M consists of a mineral material precursor of the material M and an organic binder. The inks are deposited by pouring or by extrusion.

4 Claims, 16 Drawing Sheets

U.S. PATENT DOCUMENTS

| | | | |
|---|---|---|---|
| 6,033,544 A * | 3/2000 | Demers et al. | 204/450 |
| 6,232,139 B1 * | 5/2001 | Casalnuovo et al. | 438/48 |
| 6,495,387 B2 * | 12/2002 | French | 438/52 |
| 6,738,600 B1 * | 5/2004 | Newton et al. | 455/66.1 |
| 6,746,891 B2 * | 6/2004 | Cunningham et al. | 438/52 |
| 6,842,088 B2 * | 1/2005 | Yamada et al. | 333/187 |
| 6,876,046 B2 * | 4/2005 | Prophet | 257/415 |
| 6,917,086 B2 * | 7/2005 | Cunningham et al. | 257/415 |
| 7,045,440 B2 * | 5/2006 | Huff et al. | 438/456 |
| 7,140,084 B2 * | 11/2006 | Yamada et al. | 29/25.35 |
| 7,355,324 B2 * | 4/2008 | Kim et al. | 310/320 |
| 7,562,429 B2 * | 7/2009 | Larson et al. | 29/25.35 |
| 7,642,695 B2 * | 1/2010 | Fujii | 310/320 |
| 7,741,687 B2 * | 6/2010 | Yamaguchi et al. | 257/419 |
| 7,834,524 B2 * | 11/2010 | Wang et al. | 310/346 |
| 2004/0151014 A1 * | 8/2004 | Speakman | 365/49 |
| 2005/0077612 A1 * | 4/2005 | Nikkel et al. | 257/704 |
| 2006/0132891 A1 * | 6/2006 | Kim et al. | 359/291 |
| 2006/0186759 A1 * | 8/2006 | Kim et al. | 310/320 |
| 2007/0218630 A1 * | 9/2007 | Yamaguchi et al. | 438/257 |

OTHER PUBLICATIONS

S. Pranonsatit, et al. "Self-assembled screen-printed microwave inductors", Electronic Letters, Nov. 10, 2005, pp. 1287 and 1288, vol. 41, No. 23.

* cited by examiner

M1
P

M1
P

M1
P1

M1
P1

- M1
- M2
- P1

- M1
- M2
- P1

■ M1
▒ P1

■ M1
▒ P1

M4
M3
M2
M1
P2
P1

M1, M'1
P

M1, M1'
P

Section A-A

M1,
M1'
P

M1,
M1'
P a          b

M1
M2
P

M1
M2
P

Fig. 20b
Fig. 20c
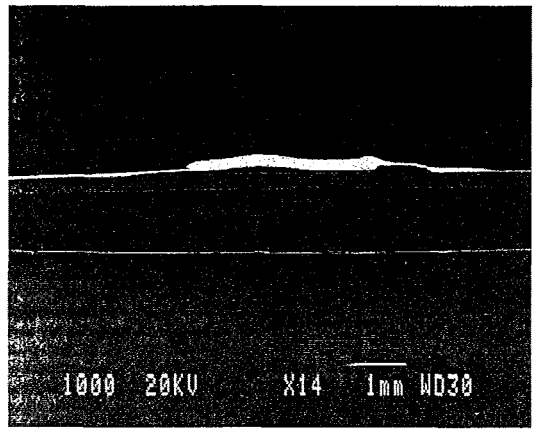
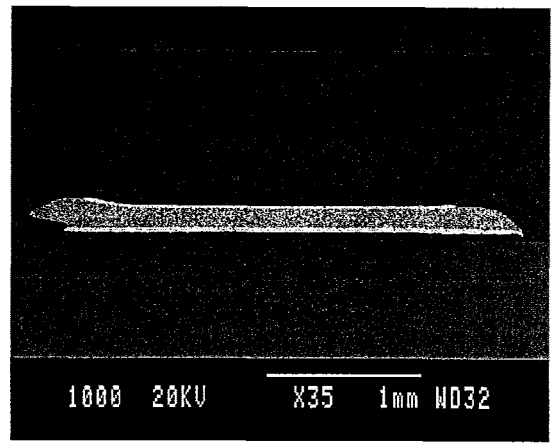
Fig. 21
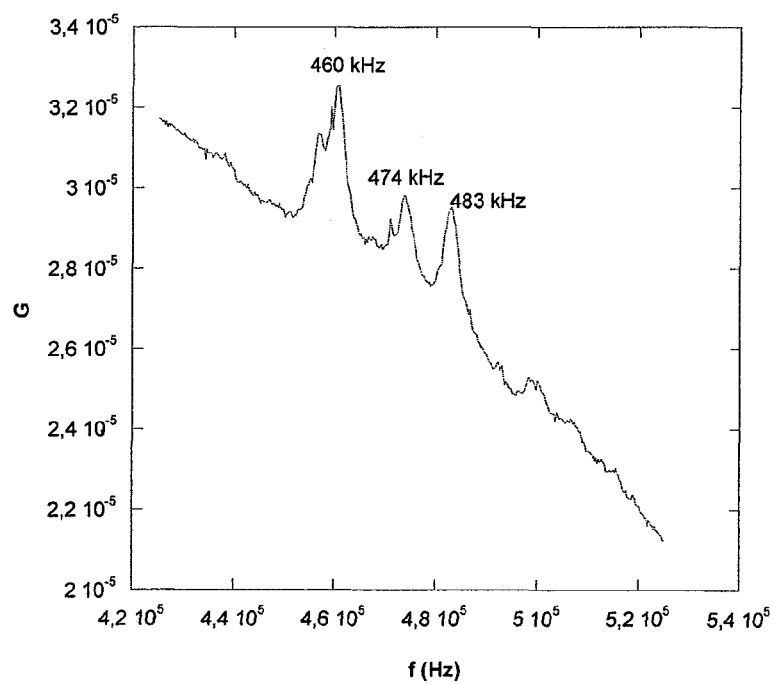

METHOD FOR PRODUCING A MULTILAYER PIEZOELECTRIC MICROCOMPONENT USING SACRIFICIAL THICK FILM TECHNOLOGY

The present invention relates to the preparation of multilayer microcomponents which may constitute a microsystem or part of a millimeter-sized microsystem, said microcomponents being at least partially released from the substrate on which they are prepared by the sacrificial thick film method.

BACKGROUND OF THE INVENTION

Numerous components having micron- or millimeter-sized dimensions are used for the preparation of various Microsystems, particularly in the fields of microelectronics, microrobotics, micromechanics, microfluidics, micromagnetism, microthermics, microoptics, or microchemistry. The various economic sectors concerned are in particular those of the automobile, space, aeronautics, home automation, health, biology, chemistry, agrifood industry, and the environment. These components may have a wide variety of shapes and they may consist of varied materials, according to their intended use. They are used in Microsystems generally designated as MEMS (MicroElectro-MechanicalSystems). Among the MEMS available on the market, mention can be made in particular of microsensors (inertia, pressure, chemical), microactuators (microvalve, microrelay, micropump) and Microsystems dedicated to chemical analysis for example. MEMS generally comprise a movable part, a sensor and/or an actuator associated with control and processing electronics.

It is known how to manufacture monolayer and/or multilayer components by indirect methods such as silicon technology, PCB (Printed Circuit Board) technology and LTCC (Low Temperature Cofired Ceramic) technology. However, these methods are time-consuming and costly, because they comprise numerous micromachining steps (masking, etching, deposition, etc.).

It is also known how to use direct methods such as prototyping techniques (inkjet, extrusion, microstereolithography) for the manufacture of monolayer and/or multilayer microcomponents. However, these techniques are not suitable for the collective manufacture of components.

G. Stecher, R. Bosch [*"Free supporting structures in thick film technology: a substrate integrated sensor" Stuttgart, 1987, Proc. 8th European Microelectronics Conf.* p. 421-427] describe a method for preparing a microcomponent consisting in depositing a provisional film consisting of a carbon-containing material, by screen printing, on a zone of the substrate, then depositing an active ceramic or plastic film on the provisional film of material and on a zone of the substrate not covered by the carbon-containing material, and finally in destroying the provisional film. The use of a carbon-containing material as a provisional film has various drawbacks. When the active material must be treated at a certain temperature for its consolidation (which is the case of ceramics for example), it is necessary to work in an inert atmosphere (nitrogen or argon) to avoid the degradation of the provisional film before the consolidation of the active film. Moreover, this atmosphere may be prohibitive for the manufacture of numerous materials that are unstable under this atmosphere.

SUMMARY OF THE INVENTION

It is the object of the present invention to propose a screen printing method that is suitable for reliably and relatively simply obtaining microcomponents consisting of varied materials, by deposition of provisional films and of chemically and mechanically stable final films, the provisional films being removed without special precautions, regardless of the composition of the final films forming the final microcomponent.

The proposed method is suitable for manufacturing a microcomponent which comprises one or more films, each consisting of a material M selected from metals, metal alloys, glasses, ceramics and glass-ceramics, at least one of the films M optionally being joined to a planar substrate by at least one zone of one of its surfaces. The said method is characterized in that it consists in:
1) depositing on a substrate one or more films of an ink P, and one or more films of an ink M, each film being deposited into a predefined pattern selected according to the structure of the microcomponent, each film of ink P and each film of ink M being at least partially consolidated before deposition of the next film;
2) effecting a total consolidation of the films of ink M partially consolidated after their deposition, to convert them to films of material M;
3) totally or partially removing the material of each of the films of ink P;

it being understood that:
  an ink P consists of a thermoset resin containing a mineral filler or a mixture comprising a mineral filler and an organic binder;
  an ink M consists of a mineral material precursor of the material M and an organic binder;
  the inks P and the inks M are deposited by pouring or by extrusion.

In a particularly preferred embodiment, the films P and the films M are deposited by pouring, the pouring being effected preferably by screen printing.

BRIEF DESCRIPTION OF THE DRAWINGS

FIG. 2a is a side view and FIG. 2b is a plan view of the substrate.

FIG. 3a is a side view and FIG. 3b is a plan view of the substrate.

FIG. 4a is a side view and FIG. 4b is a plan view of the substrate.

FIG. 5a is a side view and FIG. 5b is a plan view of the substrate.

FIG. 6a is a side view and FIG. 6b is a plan view of the substrate.

FIG. 12a shows the various steps of the method of Example 1 in a plan view and FIG. 12b shows the steps of the method of Example 1 in a side view along line A, line A shown in FIG. 12a.

FIG. 14a shows a plan view, and FIG. 14b shows a side view along line A-A.

The process of Example 4 is shown schematically in FIGS. 16a and 16b.

Figure 17:

The intended piezoelectric component of Example 5 is shown schematically in FIGS. 17a (plan view) and 17b (section).

Figure 18:
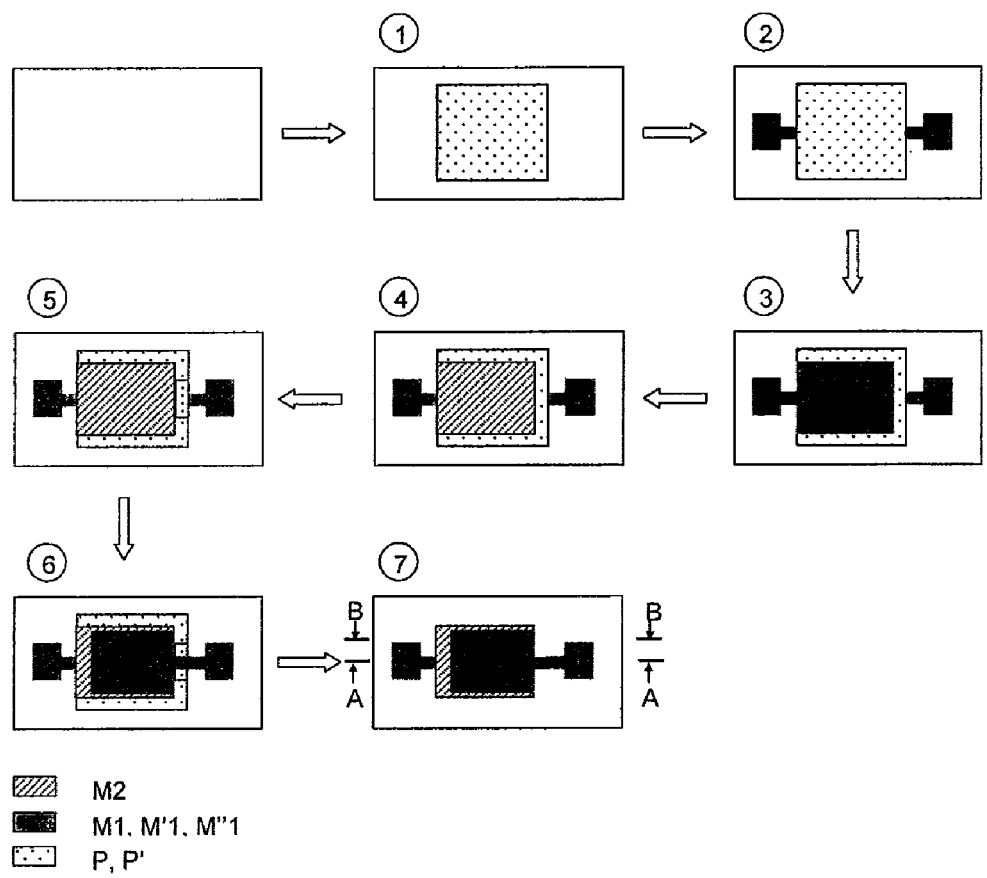

FIG. 18 shows the various steps of the method of Example 5 in a plan view. The figures indicate the step number of the method.

Figure 19:
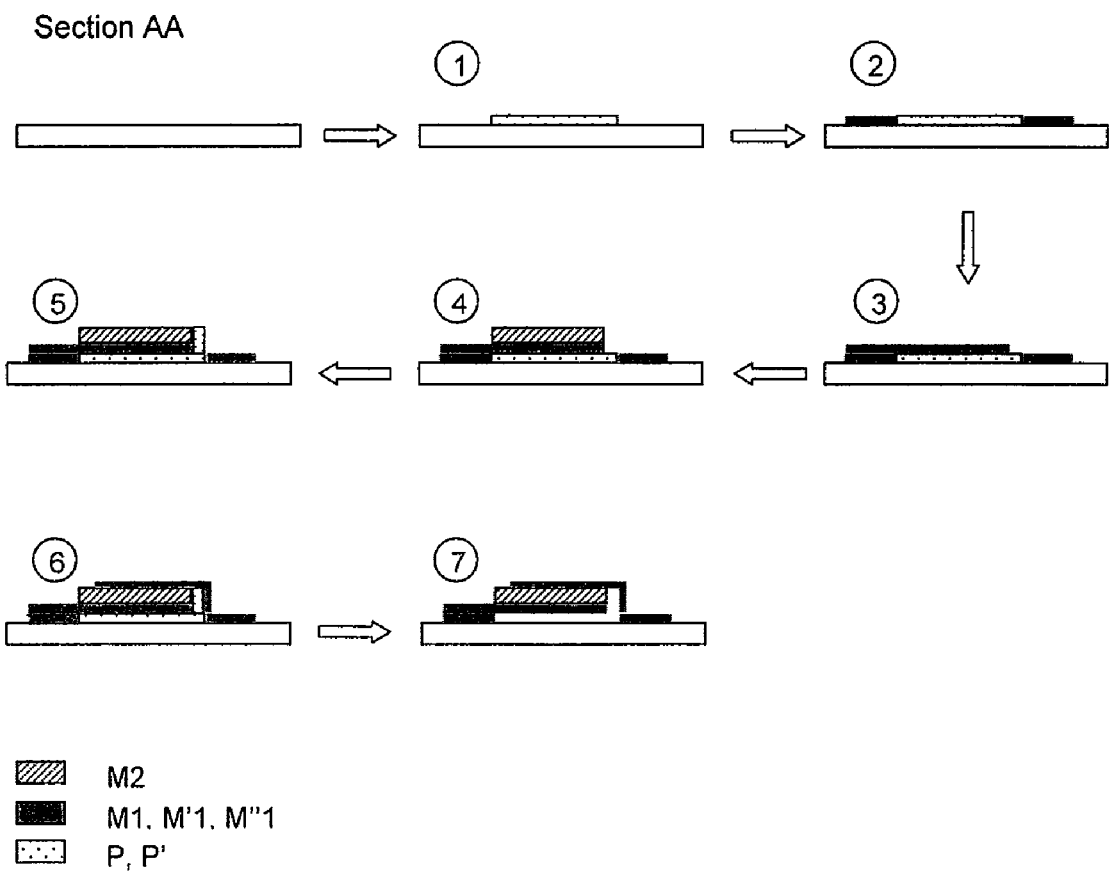

FIG. 19 shows the steps of the method of Example 5 in a side view along line A-A shown in FIG. 18.

Figure 20A:
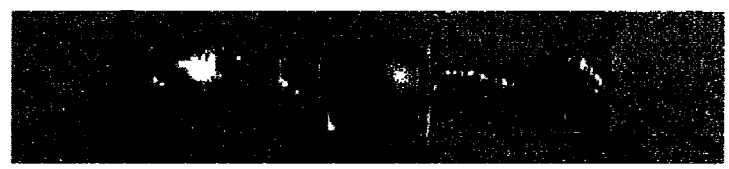

FIG. 20a shows a photograph of the piezoelectric component of Example 5. FIGS. 20b and 20c, respectively, show an SEM section of the piezoelectric component of Example 5 along line AA and line BB shown in FIG. 18.

FIG. 21 illustrates the variation in conductance of the component as a function of frequency.

DETAILED DESCRIPTION OF THE PREFERRED EMBODIMENTS

The various films deposited preferably have a thickness of between 1 μm and 1 mm, preferably between 1 μm and 500 μm, more particularly between 1 and 100 μm. For the preparation of a given microcomponent, the thickness of each ink film is determined according to the thickness of the film(s) of material M constituting said microcomponent and the potential shrinkage undergone by each ink film during its total or partial consolidation. The determination of the thicknesses of films to be deposited is within the scope of a person skilled in the art.

When the method comprises the deposition of a plurality of films of ink P and/or a plurality of films of ink M, the inks P used may be either identical or different, and the inks M may be either identical or different.

Below, the ink P used for the deposition of the $n^{th}$ film of type P is denoted as ink Pn and the corresponding film is denoted as film Pn, and the ink M of the corresponding film is denoted as film Mn. The material obtained by consolidation of a film Mn is denoted as material Mn. n is an integer, generally less than 10.

An ink P consists either of a thermoset resin that optionally contains a mineral filler, or of a mixture comprising a mineral material and an organic vehicle.

As examples of thermoset resins of an ink P, mention can be made of epoxy resin, phenolic resins, acrylic resins, polyurethanes, polyvinyl esters and polyesters.

The organic vehicle of an ink P and/or ink M contains at least one provisional binder (for example ethylcellulose, a methacrylate or a methyl methacrylate), at least one solvent (for example terpineol or butylcarbitol acetate), optionally at least one compound selected from gelling agents, plasticizers, surfactants and lubricants.

The mineral filler of an ink P may be a powder of a material selected from alkali metal or alkaline-earth metal chlorides, alkali metal or alkaline-earth metal nitrates, alkali metal or alkaline-earth metal nitrides, alkali metal or alkaline-earth metal hydroxides, alkali metal or alkaline-earth metal carbonates, alkali metal or alkaline-earth metal sulfates, alkali metal or alkaline-earth metal phosphates, alkali metal or alkaline-earth metal fluorides and alkali metal or alkaline-earth metal borides;

metal (for example Ag, Cu, Au, Fe, Ni, Ti, Sn) powders, glass powders, and ceramic powders, powders of organometallic precursor compounds;

oxides (for example $Al_2O_3$, $ZrO_2$, $TiO_2$ and $Y_2O_3$), nitrides (for example BN, TaN, TiN and $Si_3N_4$), carbides (for example TaC, TiC and WC).

The removal of the material P during the final step of the method is effected either in water, or in an acidic medium, according to the solubility of the material to be removed.

When the ink P contains a thermoset resin, the partial consolidation is effected by polymerization of the resin at a temperature of between 120° C. and 220° C. during a period of 20 min to 2 h.

When the ink P contains an organic vehicle, the partial consolidation is effected by an oven treatment at a temperature of between 120 and 150° C., during a period of between 10 to 20 min, and the total consolidation by baking between 500 and 1200° C.

For the two types of ink P, when the mineral filler is alumina, a carbide or a boride, it also acts as a diffusion barrier during the baking at high temperature.

An ink M comprises a temporary organic vehicle and a mineral component precursor of the material M constituting the microcomponent to be prepared. The organic vehicle of an ink M is selected from materials defined for the organic vehicle of an ink P, with the understanding that the vehicles of inks P and inks M used in a process may be identical or different. The mineral material precursor of the material M may be a metal powder, a glass powder, a ceramic powder, or a powder of (an) organometalic compound(s), said mineral component having for example dielectric, insulating, ion-conducting, electron-conducting, optical or magnetic properties. If the material M is a metal, it is different from an alkali metal and from an alkaline-earth metal. In the context of the present invention, ceramic means in particular an oxide, a nitride, an oxynitride, a carbide, a carbonitride, a fluoride or an oxyfluoride. In the context of the present invention, glass-ceramic means a partially recrystallized glass.

As an example of a mineral material precursor of a metal M, mention can be made of a powder of Ag, Au, Cu, Fe, Ni, Ti or Sn, or a powder of a mixture of at least two of these metals, or a powder of organometallic compound(s).

An ink M may if necessary further contain an additive for making the film adhere to the substrate. The additive may, for example, be glass or a reactive oxide. The additive is selected in particular according to the compatibility of its thermal expansion coefficient with that of the film M1 and one in contact with the substrate and with that of said substrate, and for an additive of the glass type, according to the compatibility of the softening temperature with the final consolidated temperature of the microcomponent.

The partial consolidation of a film of ink M is aimed to evaporate the organic solvent (for example terpineol or butylcarbitol acetate) contained in the ink. Consolidation consists of a heat treatment at a temperature and during a sufficient period to evaporate said organic solvent. This heat treatment may be effected by a heat treatment in an oven at a temperature of between 120 and 150° C., during a period of 10 to 20 min.

The total consolidation of a film of ink M is aimed to obtain a more or less porous densified film, for example by sintering. The total consolidation is obtained by a heat treatment at a temperature and during a period greater than those used for the partial consolidation. It may be effected for example at a temperature of between 600° C. and 1200° C., for a period of 15 min to 1 h. Consolidation may comprise an additional step, in the form of an annealing of several hours, to improve the mechanical strength and/or the microstructure of the microcomponent. Annealing temperature is preferably about 100° C. lower than that of the total consolidation.

At the lowest temperatures, the heat treatment of a film of ink M also first causes the removal of the polymer (thermoset resin) or of the organic vehicle (ethylcellulose or terpineol) from the previously deposited inks P, then possibly at the highest temperatures, the decomposition of the mineral additives of said inks P. Depending on its type, the polymer of the ink P may decompose as soon as the temperature reaches 120° C., up to 450° C. for an epoxy resin, during the temperature rise.

In general the composition of an ink P or of an ink M must meet viscosity, chemical stability and physical stability criteria compatible with the technique of extrusion or of pouring, in particular by screen printing. The viscosity is preferably between 100 and 2000 Pa·s.

In one embodiment, the method comprises an additional step, during which an additional operation is effected, for example the deposition of a preconstituted plate of a material M, a metallization by an electrochemical method, a chemical method, a PVD method, by plasma or by ink jet, or an encapsulation. Said additional step may be effected before or after the final step of removal of the film(s) of ink P, or between the deposition of two films of ink M and/or of ink P.

A microcomponent obtained by the method of the invention consists of one or more films of material M each having a thickness of between 1 µm and 500 µm, preferably between 1 µm and 100 µm. The microcomponent generally has a thickness of about one millimeter.

The method according to the invention serves to obtain a microcomponent fixed to a substrate or a free microcomponent, disengaged from the substrate.

A microcomponent that consists of a single film of material M1 and which is disengaged from the substrate is obtained when the method of the invention is implemented in the following conditions:
  the first film deposited on the subject is deposited from an ink P1;
  the second film is deposited from an ink M1, in a pattern entirely supported by the film of ink P1

A microcomponent which consists of a single film of material M and which is disengaged from the substrate is obtained when the method of the invention is implemented in the following conditions:
  the first film deposited on the subject is deposited from an ink P1;
  each of the successive films deposited from inks M is deposited in a pattern entirely supported by the film of ink P1 and by the optional other films deposited from inks P.

Figure 1:
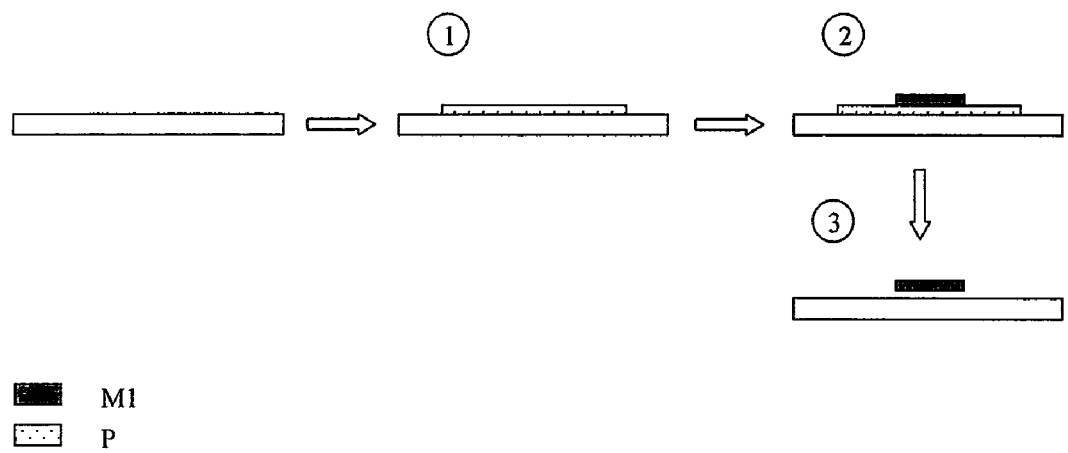
FIG. 1 schematically shows the succession of steps required for producing a microcomponent in the form of a single film M detached from the substrate on which it has been formed.

FIG. 1 schematically shows the succession of steps required for obtaining a free microcomponent comprising a single film M.

On the initial substrate, a film of ink P is deposited according to a predefined pattern, and the film of ink M is then deposited. After consolidation of the film of ink M, the film of ink P is removed and a free element is obtained consisting exclusively of a film of material M released from the substrate.

A microcomponent fixed to a substrate is obtained when the pattern in which at least one of the inks M is deposited, is not entirely encompassed within the pattern in which the film P1 deposited.

The method of the present invention serves to deposit ink films in patterns having any shape whatsoever. A pattern may be in the form of a continuous surface having a given geometry or a discontinuous surface formed of at least two disjoint zones. The combination of ink films deposited in patterns forming a continuous surface and of ink films deposited in patterns forming a discontinuous surface makes it possible to prepare microcomponents having a widely varied architecture.

The deposition of a film of ink M in a pattern forming a continuous surface (for example in a pattern representing a rectangle or a disk) gives a film of material M parallel to the plane of the substrate.

The deposition of a film of ink M in a pattern consisting of disjoint zones (for example several islands) gives a film of ink M is effected in a pattern consisting of disjoint zones for obtaining a film of material M formed of several pads perpendicular to the plane of the substrate.

The deposition of a film of ink M in a pattern consisting of a closed line (for example a circle or the contour of a quadrilateral) gives a film of material M formed of several pads perpendicular to the plane of the substrate. In one embodiment, the closed line may be interrupted in one or more zones, and the resulting film forms a series of walls perpendicular to the plane of the substrate.

A pattern according to which a film of ink M is deposited may be bounded by the shape of a film of ink P deposited before said film of ink M.

In the following discussion, when describing the structure of the microcomponent obtained, a film of material M obtained in the form of a film parallel to the plane of the substrate is designated as horizontal film, and a film of material M obtained in the form of pads or walls perpendicular to the plane of the substrate is designated as pads or vertical walls.

The combination of horizontal films and pads and/or vertical walls of materials M as defined above serves to obtain microcomponents having various architectures. The architectures are generally a combination of structural elements of the film type, the bridge type, the beam type, or the cage type.

The production of a microcomponent in the form of a film detached from the substrate on which it has been formed is shown in FIG. 1.

An element of the bridge type can be considered as the combination of pads and/or walls supporting a film, while bounding a free space under the film.

According to a first embodiment, a bridge structure comprising two pads which support a film while bounding a free space under the film, may be prepared by a method according to the invention which has the following features:

during a 1$^{st}$ step, a film of ink P1 is deposited on this initial substrate in a pattern Mo1 corresponding to said free space;

during a 2$^{nd}$ step, a film of ink M1 is deposited on the substrate and on the film P1, in a pattern Mo2 which overflows the pattern Mo1 over a part of its periphery;

during a 3$^{rd}$ step, the film P1 is totally removed and a microcomponent is obtained consisting of a film of material M1 which rests on two pads of material M1.

Figure 2A:
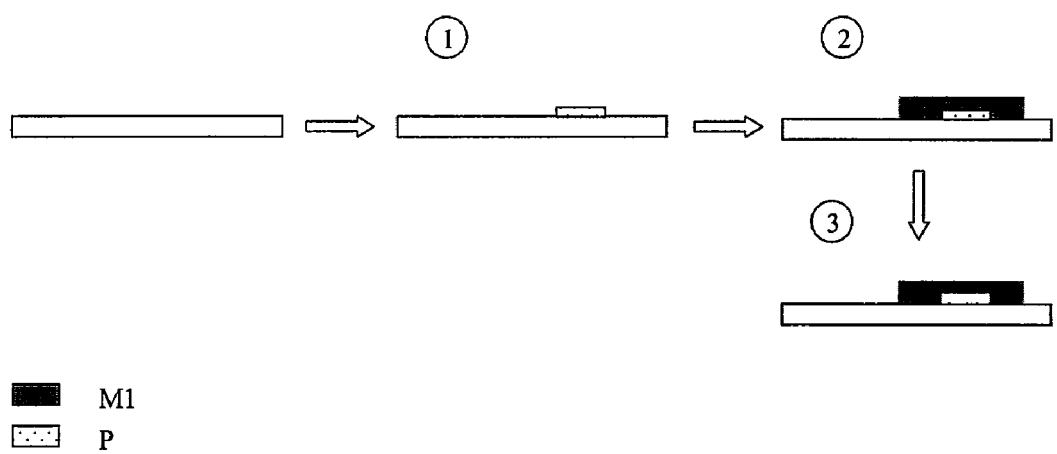
FIGS. 2a and 2b illustrate a particular case of this first embodiment of the method of the invention for preparing an element of the "bridge" type.
Figure 2B:
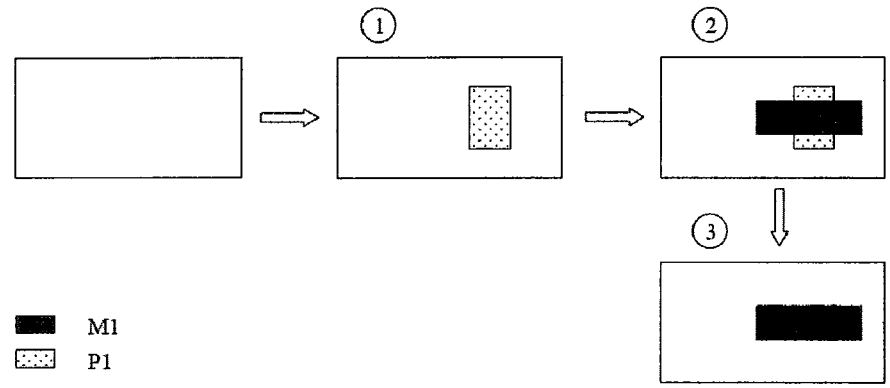

FIGS. 2a and 2b illustrate a particular case of this first embodiment of the method of the invention for preparing an element of the "bridge" type. FIG. 2a is a side view and FIG. 2b is a plan view of the substrate during the various steps.

As shown in FIGS. 2a and 2b, the method for preparing a bridge has the following features:

during a 1$^{st}$ step, a film of ink P1 is deposited on the initial substrate in a rectangular pattern Mo1 of which the sides corresponding to the length are denoted by Lp and the sides corresponding to the width are denoted by lp;

during a 2$^{nd}$ step, a film of ink M1 is deposited on the substrate and on the film P1, in a rectangular pattern Mo2 of which the length is denoted by Lm and the width is denoted by lm, and the film of ink M1 is then totally consolidated, with the following conditions:

Lp and lm are parallel to one another;
lp and Lm are parallel to one another;
$Lp \geq lm$;
$Lm > lp$;
the pattern Mo1 and the pattern Mo2 have a common central zone;

during a 3$^{rd}$ step, the film P1 is totally removed and a microcomponent is obtained consisting of a film of material M1 which rests on two pads of material M1.

According to a second embodiment, a bridge structure comprising two pads supporting a film, the pads and the film bounding a free space, may be prepared by a method according to the invention which has the following features:

during a 1$^{st}$ step, a film of ink P1 is deposited on this initial substrate in a pattern Mo1 corresponding to said free space;

during a 2$^{nd}$ step, a film of ink M1 is deposited on the substrate in a pattern Mo2 comprising two disjoint zones, each of said disjoint zones being adjacent the film of ink P1 on part of its periphery, and the film of ink M1 is then at least partially consolidated;

during a 3$^{rd}$ step, a film of ink M2 is deposited in a pattern Mo3 which covers, without overflowing, the surface of the two zones of ink M1 and at least part of the surface of the film of ink P1, and the films of ink M1 and of ink M2 are totally consolidated;

during a 4$^{th}$ step, the film P1 is totally removed and a microcomponent is obtained consisting of a film of material M2 which rests on two pads of material M1.

Figure 3A:
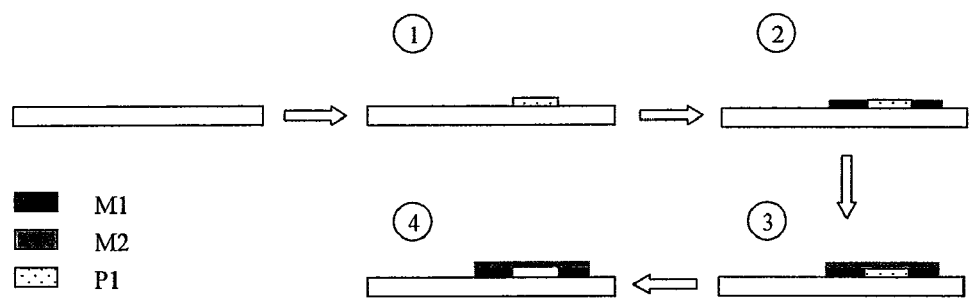
FIGS. 3a and 3b illustrate a particular case of this first embodiment of the method of the invention for preparing an element of the "bridge" type.
Figure 3B:
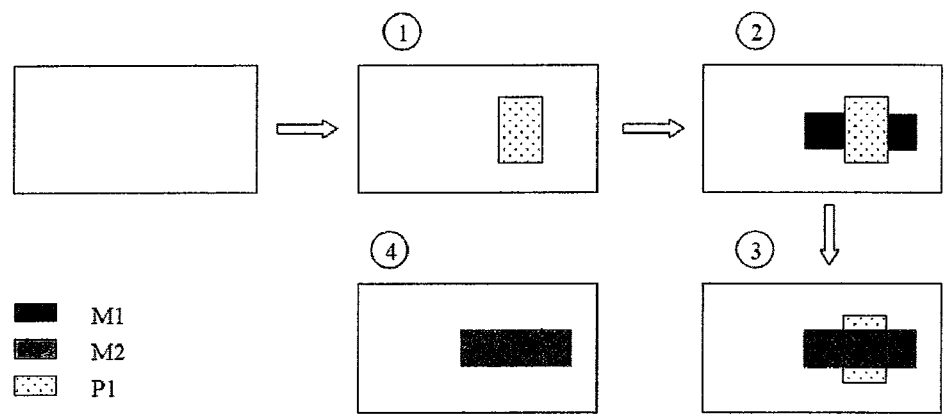

FIGS. 3a and 3b illustrate a particular case of this first embodiment of the method of the invention for preparing an element of the "bridge" type. FIG. 3a is a side view and FIG. 3b is a plan view of the substrate during the various steps.

As shown in FIGS. 3a and 3b, the method for preparing a bridge has the following features:

during a 1$^{st}$ step, a film of ink P1 is deposited on the initial substrate in a rectangular pattern Mo1 of which the sides corresponding to the length are denoted by Lp and the sides corresponding to the width are denoted by lp;

during a 2$^{nd}$ step, a film of ink M1 is deposited on the substrate in a pattern Mo2 comprising two disjoint zones, the film of M1 is at least partially consolidated, by meeting the following conditions:

the disjoint zones are located on either side of the lengths Lp of the film of ink P1, and they together form a rectangle interrupted by the pattern of the film of ink P1, each of said disjoint zones is adjacent one of the lengths Lp of the film of ink P1;

during a third step, a film of ink M2 is deposited in a rectangular pattern Mo3 which covers, without overflowing, the surface of the film of ink P1 and the surface of the two zones of ink M1, and the films of ink M1 and of ink M2 are totally consolidated;

during a 4$^{th}$ step, the film P1 is totally removed and a microcomponent is obtained consisting of a film of material M2 which rests on two pads of material M1.

Obviously, in this embodiment, the inks M1 and M2 may be identical or different. However, this embodiment is particularly advantageous for obtaining a microcomponent in which the pads which support the film and the film itself consist of different materials.

An element of the beam type can be considered as the combination of a bank or a wall upon which a film rests.

According to a 1$^{st}$ embodiment, a beam structure comprising a bank supporting a film can be prepared by a method according to the invention which has the following features:

during a 1$^{st}$ step, a film of ink P1 is deposited on the initial substrate in a pattern Mo1;

during a 2$^{nd}$ step, a film of ink M1 is deposited on the substrate and on the film P1, in a pattern Mo2 whereof part partially covers the pattern Mo1, and the film of ink M1 is then totally consolidated;

during a 3$^{rd}$ step, the film P1 is totally removed and a microcomponent is obtained consisting of a film of material M1 which rests on a bank of material M1.

Figure 4A:
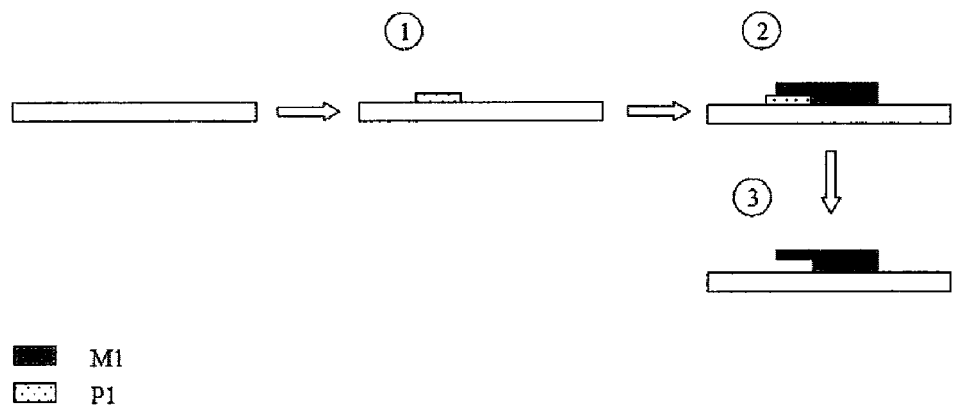
FIGS. 4a and 4b illustrate a particular case of this first embodiment of the method of the invention for the preparation of an element of the "beam" type.
Figure 4B:
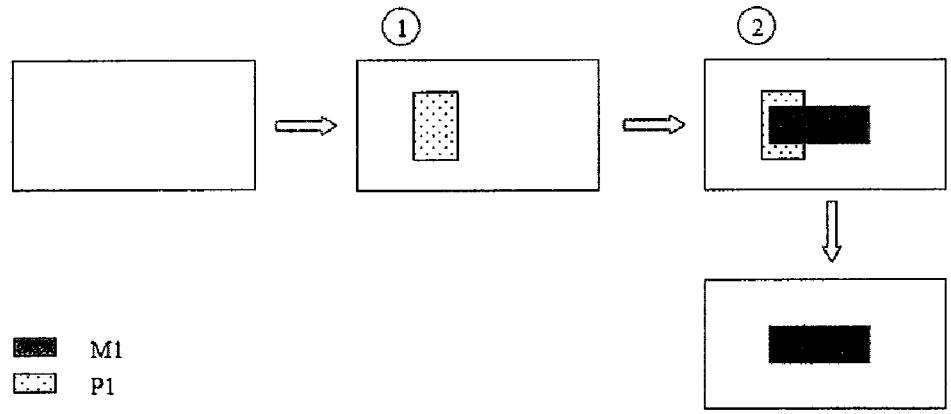

FIGS. 4a and 4b illustrate a particular case of this first embodiment of the method of the invention for the preparation of an element of the "beam" type. FIG. 4a is a side view and FIG. 4b is a plan view of the substrate during the various steps.

As shown in FIGS. 4a and 4b, the method for preparing a beam has the following features:

during a 1$^{st}$ step, a film of ink P1 is deposited on the initial substrate in a rectangular pattern Mo1 of which the sides corresponding to the length are denoted by Lp and the sides corresponding to the width are denoted by lp;

during a 2$^{nd}$ step, a film of ink M1 is deposited on the substrate and on the film P1, in a rectangular pattern Mo2 of which the sides corresponding to the length are denoted by Lm and the sides corresponding to the width are denoted by lm, and the film of ink M1 is then totally consolidated, with the following conditions:

Lp and lm are parallel to one another;
lp and Lm are parallel to one another;
$Lp \geq lm$
the relative position of the pattern is such that one of the sides lm is encompassed within the rectangular pattern bounded by the sides Lp, lp and the other side lm is outside said pattern;

during a 3$^{rd}$ step, the film P1 is totally removed and a microcomponent is obtained consisting of a film of material M1 which rests on a bank of material M1.

According to a 2$^{nd}$ embodiment, a beam structure comprising a bank supporting a film can be prepared by a method according to the invention which has the following features:

during a 1$^{st}$ step, a film of ink P1 is deposited on the initial substrate in a pattern Mo1;

during a 2$^{nd}$ step, a film of ink M1 is deposited on the substrate in a pattern Mo2 adjacent the pattern Mo1 on part of its periphery, and the film of ink M1 is then at least partially consolidated;

during a $3^{rd}$ step, a film of ink M2 is deposited in a pattern Mo3 which covers the surface of the film of ink M1 and part of the surface of the film of P1 without overflow, and the films of ink M1 and of ink M2 are totally consolidated;

during a $4^{th}$ step, the film P1 is totally removed and a microcomponent is obtained consisting of a film of material M2 which rests on a bank of material M1.

Figure 5A:
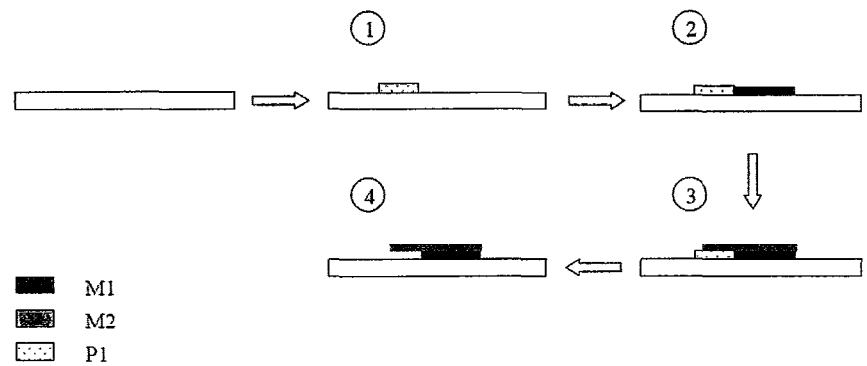
FIGS. 5a and 5b illustrate a particular case of this second embodiment of the method of the invention for the preparation of an element of the "beam" type.
Figure 5B:
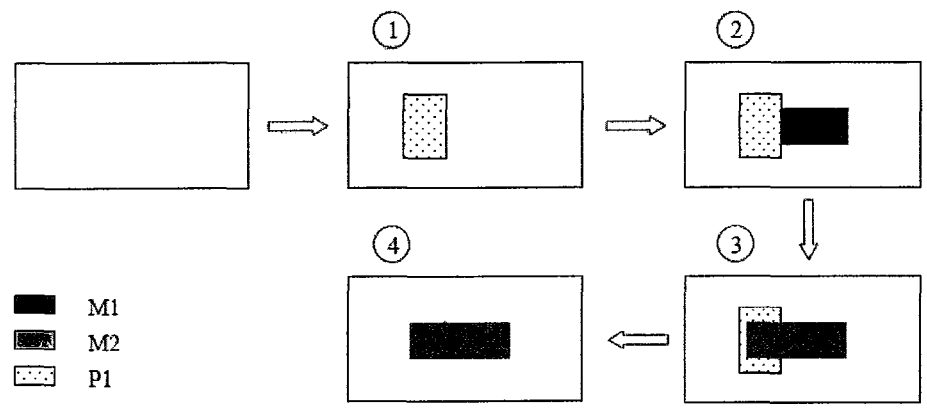

FIGS. 5a and 5b illustrate a particular case of this second embodiment of the method of the invention for the preparation of an element of the "beam" type. FIG. 5a is a side view and FIG. 5b is a plan view of the substrate during the various steps.

As shown in FIGS. 5a and 5b, the method for preparing a beam had the following features:

during a $1^{st}$ step, a film of ink P1 is deposited on the initial substrate in a rectangular pattern Mo1 of which the sides corresponding to the length are denoted by Lp and the sides corresponding to the width are denoted by lp;

during a $2^{nd}$ step, a film of ink M1 is deposited on the substrate, in a rectangular pattern Mo2 of which the sides corresponding to the length are denoted by Lm and the sides corresponding to the width are denoted by lm, and the film of ink M1 is at least partially consolidated, meeting the following conditions:

Lp and lm are parallel to one another;
lp and Lm are parallel to one another;
$Lp \geq lm$;
one of the sides lm is adjacent one of the sides Lp, and the other side lm is outside the pattern (Lp, lp);

during a $3^{rd}$ step, a film of ink M2 is deposited in a rectangular pattern Mo3 which covers the surface of the film of ink M1 and part of the surface of the film of P1 without overflow, and the films of ink M1 and of ink M2 are totally consolidated;

during a $4^{th}$ step, the film P1 is totally removed and a microcomponent is obtained consisting of a film of material M2 which rests on a bank of material M1.

As in the previous case, this embodiment is particularly advantageous when the inks M1 and M2 are different, for obtaining a microcomponent in which the bank that supports the film and the film itself consists of different materials.

The embodiments described in relation to FIGS. 4a and 4b on the one hand, and FIGS. 5a and 5b on the other, serve to obtain a microcomponent comprising a film of material M2 supported at one of its ends by a bank of material M1, the two materials being identical or different.

Similar methods serve to obtain a film of material M2 supported by a bank of material M1 not at one of its ends, but in a central part.

According to a particular embodiment, a beam structure comprising a central bank supporting a film can be prepared by a method according to the invention which has the following features:

during a $1^{st}$ step, a film of ink P1 is deposited on the initial substrate in a pattern Mo1 comprising two disjoint zones;

during a $2^{nd}$ step, a film of ink M1 is deposited on the substrate and on the film P1, in a pattern Mo2 which partially covers part of each zone of the pattern Mo1;

during a $3^{rd}$ step, the film P1 is totally removed and a microcomponent is obtained consisting of a film of material M2 which rests on a bank of material M1.

Figure 6A:
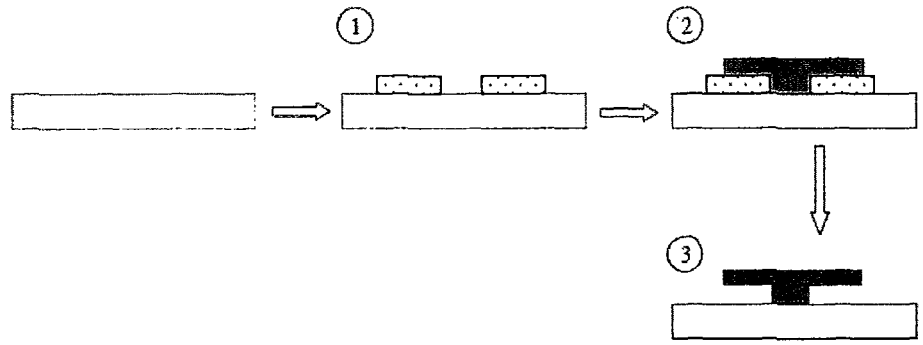
FIGS. 6a and 6b illustrate a particular case of this embodiment of the method of the invention for the preparation of a beam supported by a central bank.
Figure 6B:
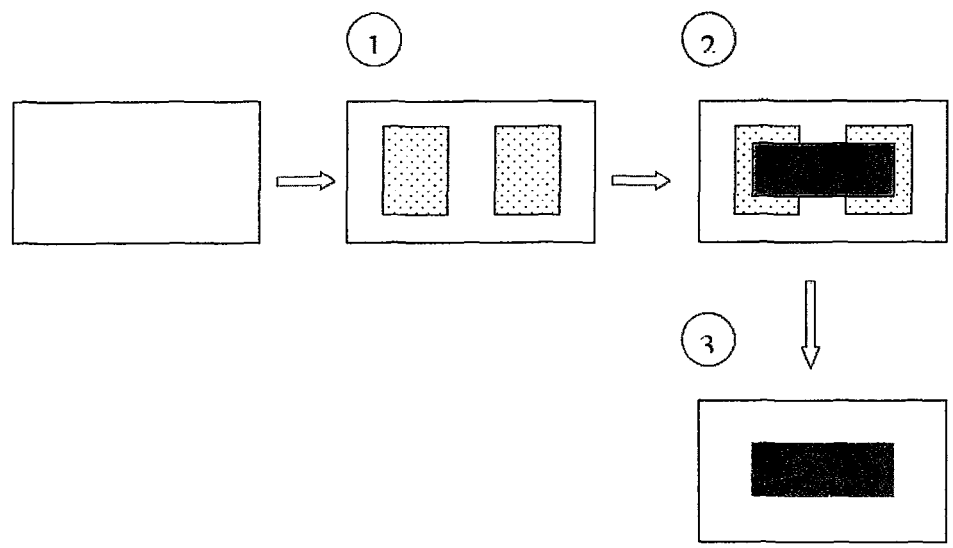

FIGS. 6a and 6b illustrate a particular case of this embodiment of the method of the invention for the preparation of a beam supported by a central bank. FIG. 6a is a side view and FIG. 6b is a plan view of the substrate during the various steps.

As shown in FIGS. 6a and 6b, the method for preparing a beam had the following features:

during a $1^{st}$ step, a film of ink P1 is deposited on the initial substrate in a pattern Mo1 comprising two identical rectangles of which the sides corresponding to the length are denoted by Lp and the sides corresponding to the width are denoted by lp the two rectangles Lp, lp are themselves inscribed within a rectangle;

during a $2^{nd}$, a film of ink M1 is deposited on the part of the substrate between the two zones of the film P1 and on the film P1, in a rectangular pattern Mo2 of which the sides corresponding to the length are denoted by Lm and the sides corresponding to the width are denoted by lm, and the film of ink M1 is at least partially consolidated, meeting the following conditions:

Lp and lm are parallel to one another;
lp and Lm are parallel to one another;
$Lp \geq lm$;
one of the sides lm is encompassed within one of the rectangles Lp, lp and the other side lm is encompassed in the other rectangle Lp, lp;

during a $3^{rd}$ step, the film P1 is totally removed and a microcomponent is obtained consisting of a film of material M2 which rests on a bank of material M1.

Figure 7A:
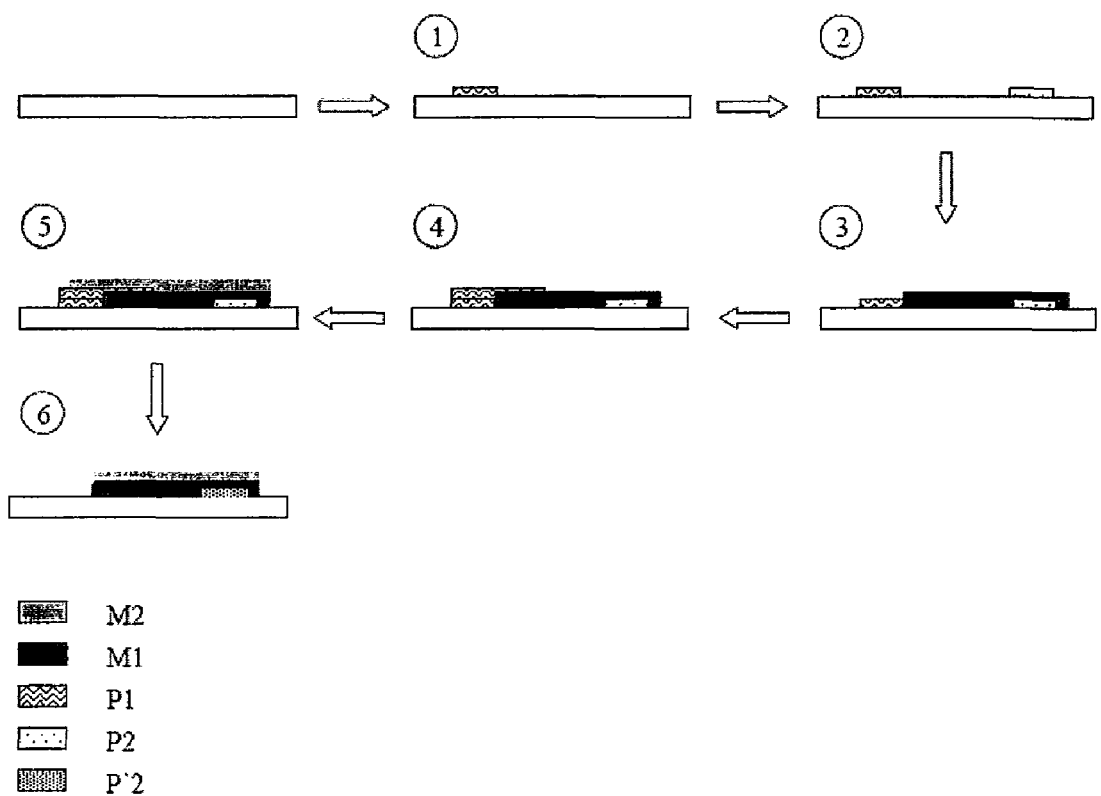
FIGS. 7a and 7b illustrate an embodiment of the method of the invention in which a microcomponent is obtained associating an element of the bridge type with an element of the beam type.
Figure 7B:
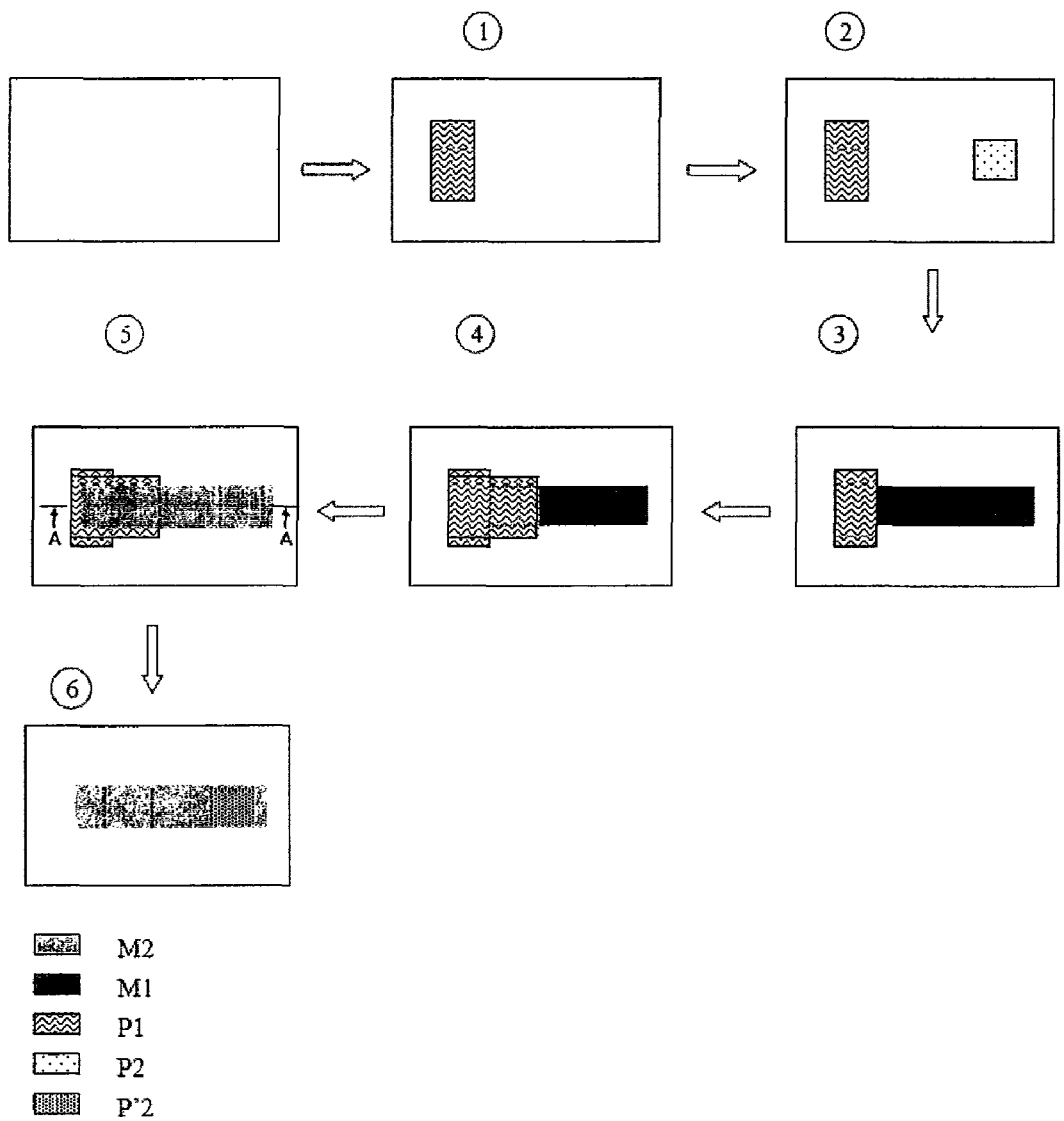

FIGS. 7a and 7b illustrate an embodiment of the method of the invention in which a microcomponent is obtained associating an element of the bridge type with an element of the beam type. The method is characterized in that:

during the $1^{st}$ step, an ink P1 is deposited on the substrate on a zone 1 for serving to support the formation of the beam elements;

during the second step, an ink P2 is deposited on said substrate, on a zone 2 disjoint from zone 1 and serving to support the upper wall of the bridge;

during the $3^{rd}$ step, a film of ink M1 is deposited in a pattern described with reference to FIGS. 2a and 2b for the formation of a bridge, and said film is at least partially consolidated;

during the $4^{th}$ step, a film of ink P1 is deposited on the film of ink M1, at the end of the film M1 which is in contact with the film of ink P1 deposited during the $1^{st}$ step;

during the $5^{th}$ step, a film of ink M2 is deposited in a pattern described with reference to FIGS. 4a and 4b for the formation of a beam, and the films M1 and M2 are totally consolidated;

during the $6^{th}$ step, the films P1 are removed.

In this embodiment, the inks P1 and P2 may be identical or different, and the inks M1 and M2 may be identical or different.

According to the ink P2 used, the consolidation treatment of the films M1 and M2 causes the total removal of the ink P2 or a simple degradation to form a material P'2. According to the intended use of the microcomponent thus obtained, the material P'2 can either be preserved, or the microcomponent can be subjected to an additional step for the total removal of P'2.

Figure 8A:
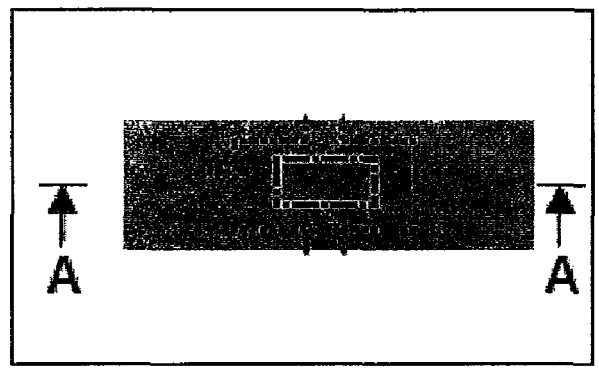
FIGS. 8a and 8b illustrate the steps of a method implemented for obtaining a microcomponent of the open cage type.
Figure 8B:
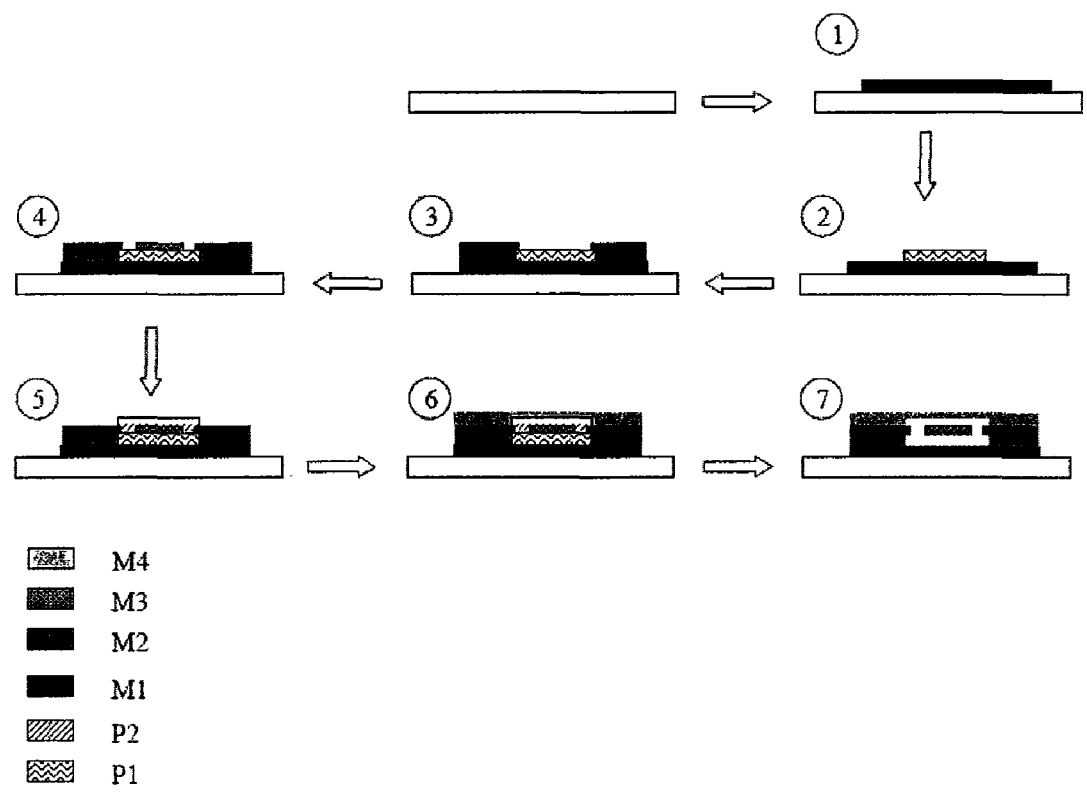

FIGS. 8a and 8b illustrate the steps of a method implemented for obtaining a microcomponent of the open cage type. Said microcomponent comprises an element of the bridge type in which the bridges are partially open, forming an open cage.

FIG. 8a is a plan view of the finished microcomponent, schematically showing the zones in which the various inks are deposited.

the largest rectangular zone, bounded by a continuous line, represents the substrate upon which the microcomponent is constructed.

the gray zone represents the pattern according to which the inks M1 and M4 intended to form the lower wall and the upper wall of the cage respectively are deposited.

the two disjoint zones bounded by the outer contour of the gray zone and by the dotted lines . . . correspond to the pattern according to which the ink M2 intended for form the sidewalls of the cage is deposited.

the rectangular zone bounded by the line -●-●- corresponds to the pattern according to which the ink M3 intended to form the free object inside the case is deposited.

the zone bounded by the line . . . represents the zone according to which the inks P1 and P2 are deposited.

FIG. 8b is a side section along line A-A of the elements undergoing preparation during the various steps. As shown in FIGS. 8a and 8b, the method for preparing a microcomponent forming a partially closed cage and containing a free element has the following features:

during a first step, an ink M1 is deposited on the substrate in a pattern corresponding to the bottom of the cage, and the film M1 is totally consolidated;

during a second step, an ink P1 is deposited in a pattern which corresponds to the base of the empty space at the center of the cage;

during a $3^{rd}$ step, an ink M2 is deposited around the film of ink P1, in a pattern that corresponds to the side walls of the cage;

during a $4^{th}$ step, an ink M3 is deposited on the zone supporting the ink P1, in a pattern that corresponds to the free element;

during a $5^{th}$ step, an ink P2 is deposited in a pattern corresponding to that of the ink P1;

during a $6^{th}$ step, an ink M4 is deposited in a pattern similar to the pattern of the ink M1;

during a $7^{th}$ step, the inks P1 and P2 are totally removed;

with the understanding that each of the films M2 to M4 is at least partially consolidated before the deposition of the next film, and that a total consolidation is completed before the removal of the inks P1 and P2.

For the preparation of a cage containing a free element, the inks P1 and P2 may obviously be identical or different, in the same way as the inks M1 to M4.

For the embodiments of the method of the invention described above, the microcomponents in the form of a bridge, beam, combined bridge/beam elements, or a cage, are joined to the substrate on which they have been prepared. To obtain an element in free form, it suffices to reproduce the methods described above by applying the first film of ink, not directly to the substrate, but to a substrate supporting a preliminary film of ink P deposited in a pattern that totally contains at least the pattern according to which the film M1 is deposited. The removal of this film during the final step releases the microcomponent.

The various embodiments of the method of the invention are provided above as examples. However, the invention must not be limited to these embodiments. Numerous alternatives, which are within the scope of a person skilled in the art, form part of the present invention.

The method proposed is advantageously implemented for the preparation of various Microsystems used in microelectronics, microrobotics, micromechanics, microfluidics, micromagnetics, microthermics, microoptics, microchemistry, etc. Said Microsystems are used in particular in the automotive, space, aeronautics, home automation, health, biology, agrifood and environmental fields. By way of example, mention can be made of thermal actuators (usable to construct a switch, or for the handling of micro-objects), millimeter-sized heating resistors which are partially disengaged from their support, supports supporting microchannels, and piezoelectric transformers.

Figure 9:
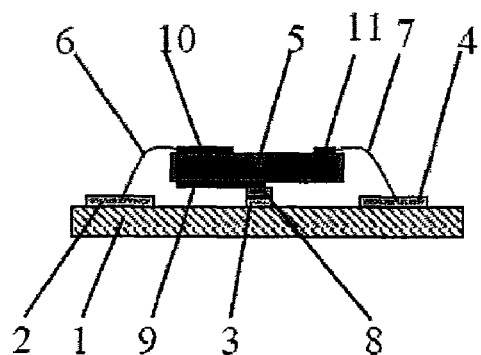
FIG. 9 shows an example of a piezoelectric transformer.

An example of a piezoelectric transformer is shown in FIG. 9.

The transformer comprises an alumina substrate (1) on which electrodes (2, 3, 4) are transferred, and a transducer consisting of a piezoelectric ceramic (5) metallized and preferably biased in two directions.

The substrate (1) and the transducer (5) are connected electrically by means of wires (6) and (7) and are joined by an electrically conducting bank (8) deposited by screen printing, which also provides the electrical link between the substrate and the metallized ceramic.

The transducer comprises three electrodes (9), (10) and (11). The pair of electrodes (9) and (10) corresponds to the primary phase of the transformer, and the pair of electrodes (9) and (11) corresponds to the secondary phase of the transformer.

The application of an AC voltage across the terminals of the primary electrodes (9 and 10) causes a mechanical deformation of the structure by reverse piezoelectric effect, which produces on the secondary electrodes (9 and 11) an AC voltage of which the amplitude is a function of the transducer geometry and the operating frequency. When the excitation is produced for a frequency close to the resonant frequency, the vibration amplitudes and the elastic deformation energy are high. The transformer can then have a high transformation ratio, because said transformation ratio is proportional to the ratio of the length to the thickness of the piezoelectric ceramic.

Figure 10:
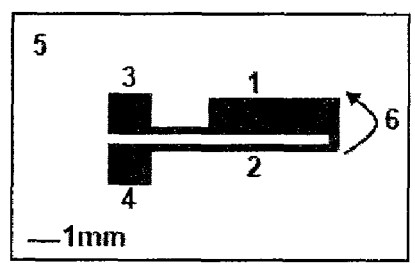
FIG. 10 shows a millimeter-sized thermal actuator.

FIG. 10 shows a millimeter-sized thermal actuator. The actuator comprises two arms 1 and 2 which have the same thickness and different widths, and two zones 3 and 4 for adhesion to a substrate 5. The actuator is joined to the substrate 5 by two pads placed under the attachment zones. During its use, the flow of the current causes a higher increase in the temperature in the smaller section arm 2, causing a greater expansion of this arm, and in consequence a horizontal deviation parallel to the substrate, in the direction indicated by the arrow (6).

Figure 11:
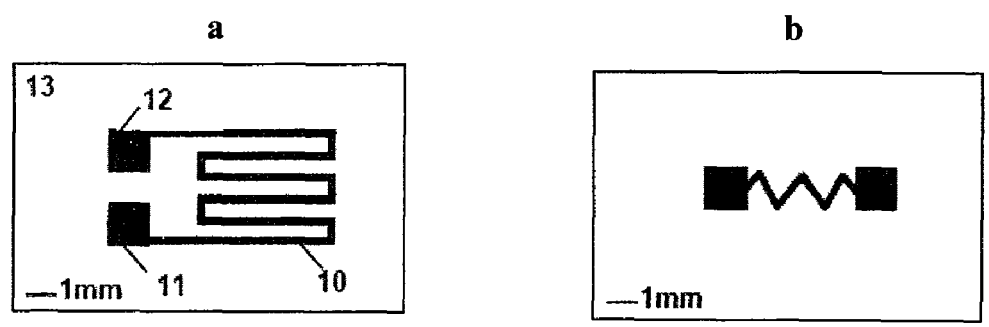
FIGS. 11a and 11b show two forms of resistors which can be obtained by the method of the invention.

FIGS. 11a and 11b show two forms of resistors which can be obtained by the method of the invention.

A resistor comprises a filament (10) connected to the substrate (13) by two attachment zones (11, 12).

The resistors obtained by the method of the invention are partially disengaged from their support, which has the effect of:

decreasing the power consumption (especially in the sensors and the microreactors), decreasing the thermomechanical stresses applied to the substrate by the heating of the resistor (an advantageous property particularly for fuses, networks of resistors-temperature sensors, gas sensors, microreactors, micropumps);

decreasing the thermal inertia, which is advantageous particularly for sensors and for degassing.

The present invention is illustrated by the following concrete examples, to which it is however not limited.

EXAMPLE 1

Thermal Actuator

Preparation of a Thermal Actuator

A thermal actuator shown in FIG. 10 was prepared by the method of the invention, on an alumina substrate.

The dimensions of the arms 1 and 2 are as follows:

| Arm | Length | Thickness | Width |
|---|---|---|---|
| 1 | 3.3 mm | 22 µm | 590 µm |
| 2 | 2.4 mm | 22 µm | 140 µm |

Figure 12A:
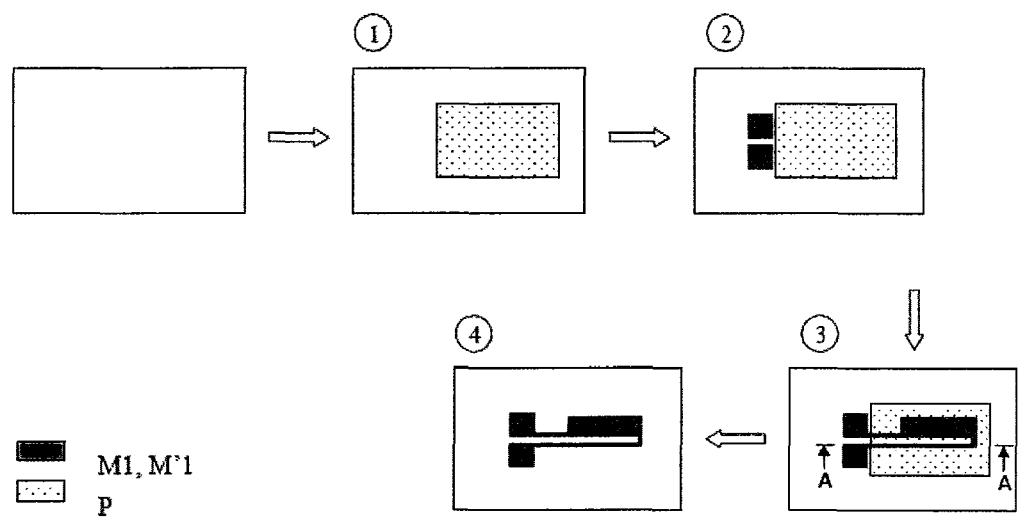

FIG. 12a shows the various steps of the method in a plan view.

Figure 12B:
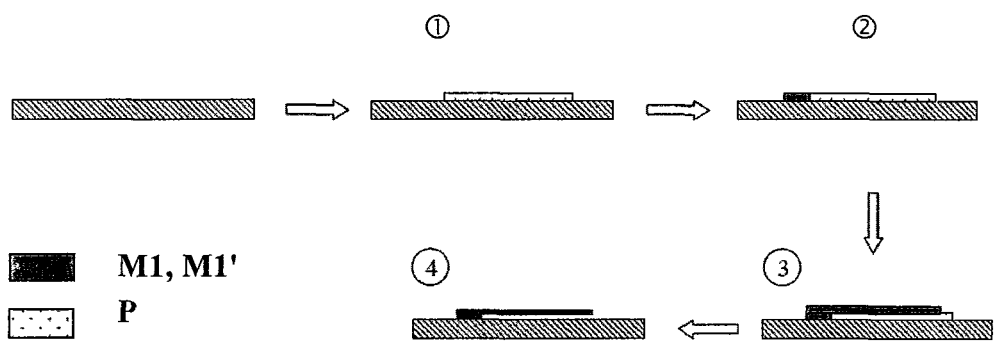

FIG. 12b show the steps of the method in a side view along line A-A shown in FIG. 12a.

A film of material P is deposited on a substrate during the step ①, and said film is consolidated;

during step ②, a film of material M1 is deposited, alongside the film P, in the form of two zones corresponding to the pads under the zone 3 and 4 of the actuator, and said film M1 is partially consolidated;

during the step ③, a film of material M'1 is deposited according to the pattern shown in FIGS. 12a and 12b, and a total consolidation is carried out;

during step ④, the material P is removed by a short-term immersion (less than 1 min) in an aqueous $H_3PO_4$ solution (1 mol/L).

Four tests were performed using, for each test, an alumina substrate and an ink P containing 55% $SrCO_3$ and 45% epoxy resin (by weight). The inks M1 and M'1 used in the various tests are indicated in the following table:

Test 1: silver-containing film sold under the trade name Ag9912-A by ESL;

Test 2: silver-containing film sold under the trade name Ag9912-A NB by ESL;

Test 3: copper-containing ink sold under the trade name QP153 by DuPont;

Test 4: copper ink obtained from a copper powder sold by CERAC and an organic vehicle sold under reference 400 by ESL.

For each of the tests, the consolidation of the ink P during the $1^{st}$ step and the partial consolidation of step 2 were each carried out at 125° C. for 25 min.

The total consolidation of step 3 was effected by a heat treatment of 1 hour comprising a temperature rise of 22 min, a hold of 16 min at the maximum temperature $T_p$ different in the various tests, a temperature lowering in 22 min. The temperatures $T_p$ are given in the table below:

| Test | $T_p$ |
|---|---|
| 1 | 850° C. |
| 2 | 900° C. |
| 3 | 950° C. |
| 4 | 950° C. |

Characterization of the Thermal Actuators

The effects of the expansion of the arms of the actuator were observed. When the current is injected into the arms of the actuator, a horizontal shift is observed parallel to the substrate on the screen of an optical microscope (20× magnification) comprising a built-in vernier. The accuracy is about ±3 µm.

The horizontal deviation observed is 23 µm for an injected power of 0.5 W, for the two copper actuators (obtained respectively by tests 3 and 4), and 37 µm for an injected power of 1.8 W for two silver actuators (obtained respectively by tests 1 and 2).

EXAMPLE 2

Heating Resistors

Preparation of the Heating Resistor

Figure 13A:
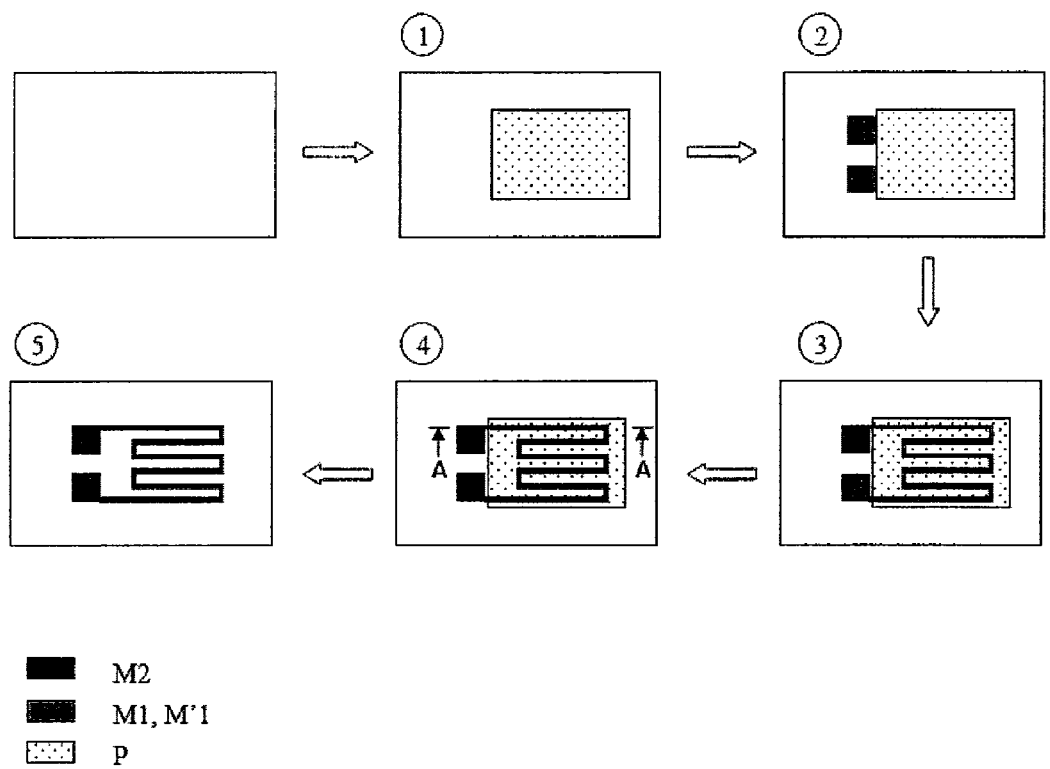
FIG. 13a shows the various steps of a method of Example 2 in a plan view and FIG. 13b shows the steps of the method of Example 2 in a side view alone line A.

A resistor as shown in FIG. 13a was prepared.

FIG. 13a shows the various steps of a method in a plan view.

Figure 13B:
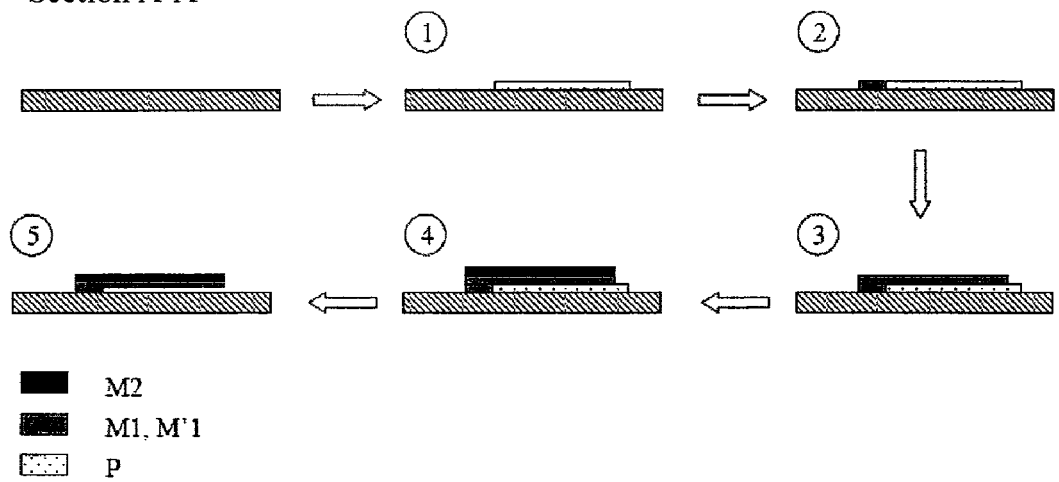

FIG. 13b show the steps of the method in a side view along line A-A shown in FIG. 11a.

On a substrate, during the step ①, a film of material P is deposited, and said film is consolidated in the conditions indicated in example 1;

during step ②, a film of material M1 is deposited, alongside the film P and along the same side of the film P, in the form of two zones corresponding to the pads under the zones 11 and 12 of the resistor (FIG. 11a), and said film M1 is partially consolidated in the conditions indicated in test 2 of example 1;

during step ③, a film of ink M'1 is deposited according to the pattern shown in FIG. 13a and representing the shape of the filament, and a partial consolidation is carried out in the conditions indicated for test 2 in example 1;

during the step ④, a film of ink M2 is deposited according to the same pattern as the one used for the ink M'1 and a total consolidation is carried out, in the conditions indicated for test 2 in example 1;

during step ⑤, the material P is removed in the conditions indicated in example 1.

A resistor as shown in FIG. 11b is obtained by a similar method, with the following differences:

during step ②, the zones of the film M1 are placed along two opposite sides of the film P;

the film M'1 intended to form the filament is deposited along a broken line joining the two zones of film M1.

The method was implemented using an alumina substrate and the following inks:

Ink P: ink containing 55% $SrCO_3$ and 45% epoxy resin (by weight);

Inks M1, M'1: silver-containing ink sold under the trade name Ag9912-A by ESL;

Ink M2: platinum-containing ink sold under reference 5544 by ESL.

The filament of the resistors obtained has a thickness of 18 µm, a width of 180 µm and a length of about 20 mm.

Characterization of Resistors

The performance of the resistors obtained was tested. After calibration, the resistor was connected to a current generator, and the power injection required to reach a temperature of between ambient temperature and temperatures close to the melting point was determined.

The heating power serving to reach 500° C. using the resistor partially released from the substrate according to the invention represents about one-third of the power required by a resistor completely joined to the substrate. For a power of about 2.5 W, a break in the substrate is observed when it is in direct contact with the resistor, whereas the resistor partially released from the substrate manufactured according to the invention is not degraded. If the injected power is further increased, the resistor according to the invention breaks by melting of the filament, but the substrate is not damaged.

EXAMPLE 3

Preparation of Microchannels

Figure 14A:
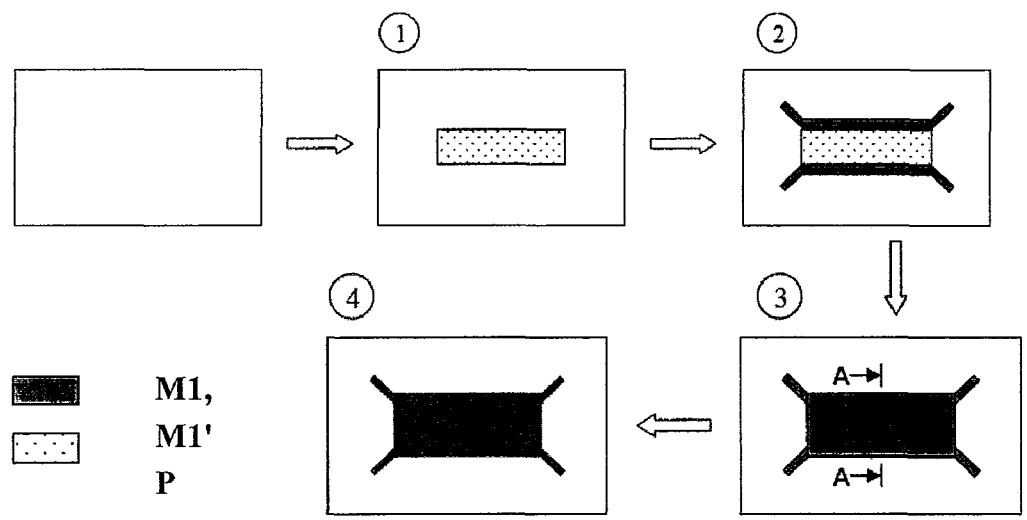
FIGS. 14a and 14b schematically show preparation of microchannels as described in Example 3.
Figure 14B:
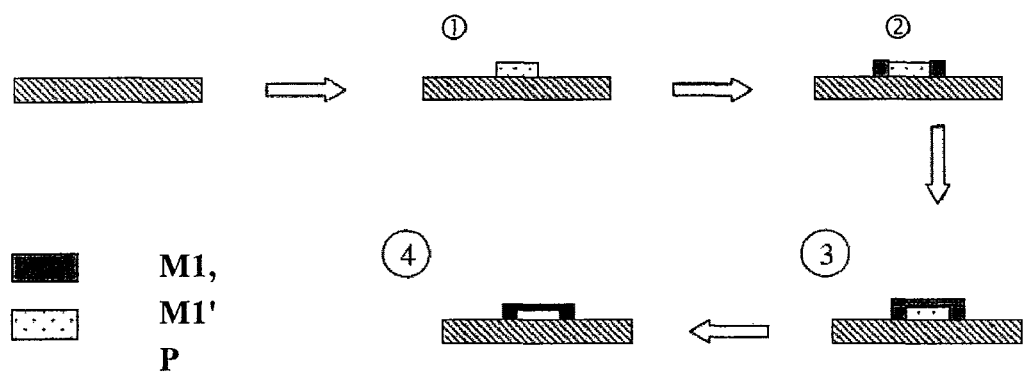

Microchannels were prepared by the process shown schematically in FIGS. 14a and 14b. FIG. 14a shows a plan view, and FIG. 14b shows a side view along line A-A indicated in step ③ of FIG. 14a.

An ink P is deposited on a substrate during step ①, and said film is consolidated in the same conditions as in example 1;

during step ②, along two opposite edges of the film of ink P, a film of ink M1 is deposited, in the form of two zones corresponding to the side walls of the desired microchannel, and said film of ink M1 is partially consolidated;

during step ③, a film of ink P forming the upper wall of the microchannel is deposited above the film P and the film M1, an ink film M'1 forming the upper wall of the microchannel, and a total consolidation is carried out;

during step ④, the material P is removed in the conditions indicated in example 1.

Figure 15:
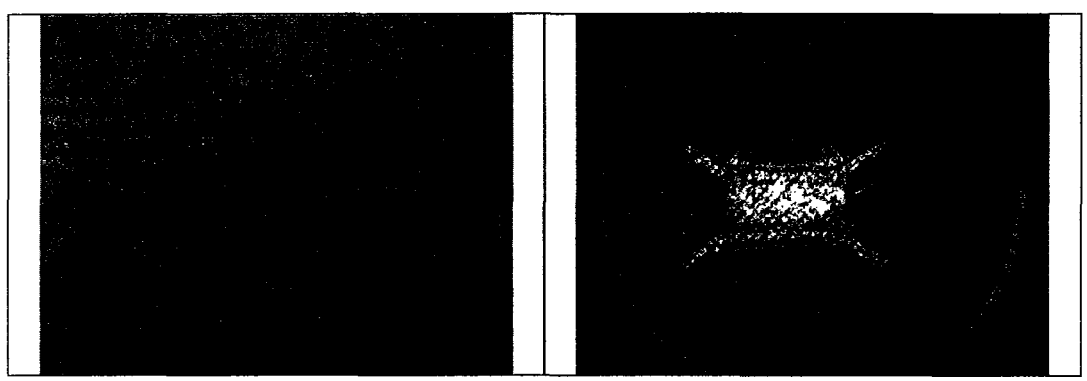
FIG. 15a shows a plan view of a number of microchannel structures based on ceramic as described in Example 3.
FIG. 15b shows an image of a silver microchannel traversed by a 35 μm diameter platinum wire as described in Example 3.

FIG. 15a shows a plan view of a number of microchannel structures based on ceramic. The following inks were used for the preparation of these structures:

Ink P: ink containing 55% $SrCO_3$ and 45% epoxy resin (by weight);

Inks M1, M'1: dielectric ink sold by ESL under reference 4702. The partial consolidation of step 2 was effected by heating to 125° C. for 20 min. The total consolidation of step 3 was effected by a heat treatment of 1 hour comprising a temperature rise of 22 min, a hold of 16 min at the maximum temperature of 870° C., followed by a temperature lowering in 22 min.

FIG. 15b shows an image of a silver microchannel traversed by a 35 µm diameter platinum wire. The following inks were used for the preparation of the microchannel:

Ink P: ink containing 55% $SrCO_3$ and 45% epoxy resin (by weight);

Ink M1: silver ink sold under the trade name Ag9912-A by ESL. The partial consolidation of step 2 and the total consolidation of step 3 were effected in the conditions indicated in test 1 of example 1.

EXAMPLE 4

Assembly of a Piezoelectric Transformer

The method proposed is implemented for the assembly of a piezoelectric transformer as shown schematically in FIG. 9.

Figure 16A:
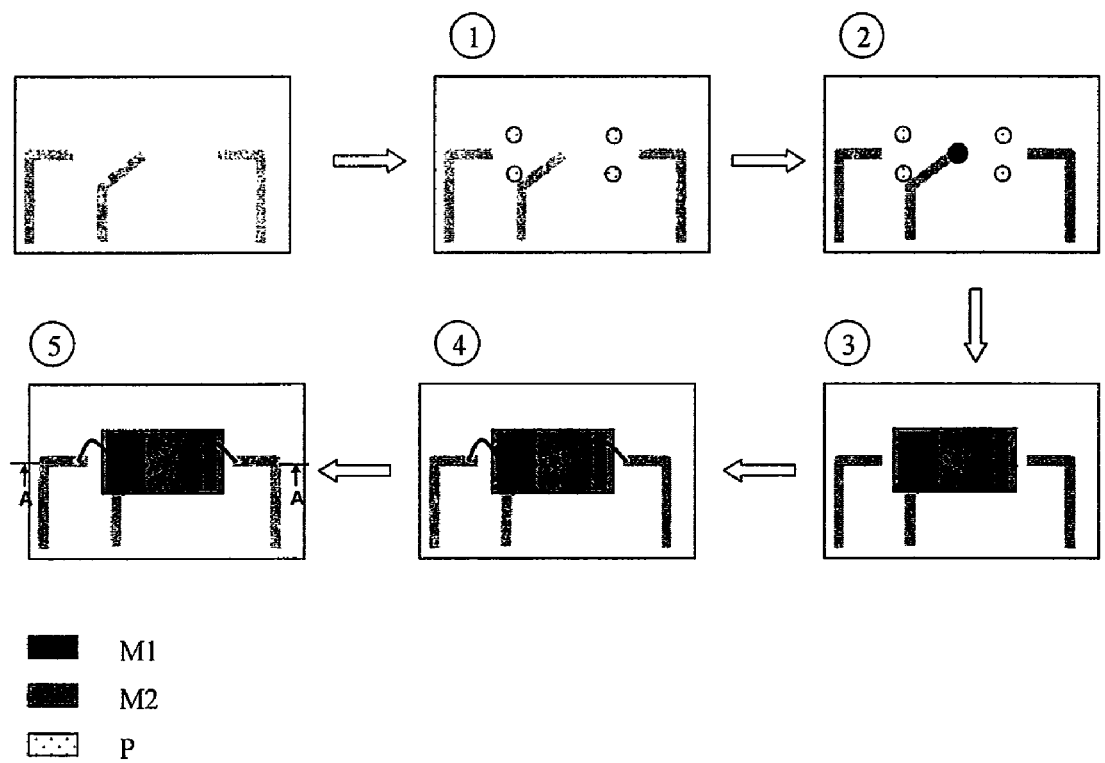
FIG. 16a shows a plan view of the steps of the method and FIG. 16b shows a side view along line A-A.
Figure 16B:
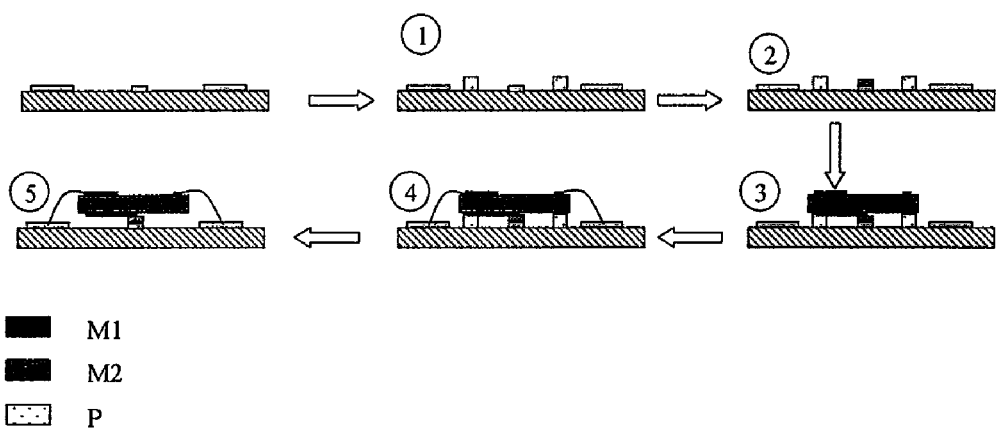

The process is shown schematically in FIGS. 16a and 16b. FIG. 16a shows a plan view of the steps of the method, and FIG. 16b shows a side view along line A-A indicated on step 5 of FIG. 16a.

The successive films are deposited on an alumina substrate, on which conducting tracks have been deposited by screen printing, and then subjected to baking at 850° C. for 15 min. Said conducting tracks correspond to the electrodes 2, 3 and 4 shown in FIG. 9.

during step (1), an ink P is deposited in the form of 4 pads on the pretreated alumina substrate, and consolidations carried out in the conditions indicated in example 1;

during step (2), an ink M1 is deposited according to an island-shaped pattern designed to form the bag 8 of FIG. 9, and partial consolidation is carried out;

during step (3), a metallized ceramic plate comprising the electrodes 9, 10 and 11 are deposited along precise markers, on the 4 pads of material P and on the bank 8 of ink M1 previously deposited, and partial consolidation is carried out;

during step (4), with the film of ink M1 and electrical conducting wires, the electrodes of the ceramic substrate are connected to those of the piezoelectric ceramic, and total consolidation is carried out;

during step (5), the material P is totally removed in the conditions indicated in example 1.

The inks used are as follows:

Ink P: ink containing 55% $SrCO_3$ and 45% epoxy resin (by weight);

Ink M1: gold-containing ink sold under the trade name 8836 by ESL.

The partial consolidation of steps 2 and 3 was effected by stoving at 125° C. for 20 min. The total consolidation of step 4 was effected by a heat treatment of 1 hour comprising a temperature rise of 22 min, a hold of 16 min at the maximum temperature of 850° C., followed by a temperature lowering in 22 min.

EXAMPLE 5

Suspended Piezoelectric Component

Preparation of the Component

The intended piezoelectric component is shown schematically in FIGS. 17a (plan view) and 17b (section).

FIG. 18 shows the various steps of the method in a plan view. The figures indicate the step number of the method.

FIG. 19 shows the steps of the method in a side view along line A-A shown in FIG. 18.

FIG. 20a shows a photograph of the piezoelectric component. FIGS. 20b and 20c respectively show an SEM section along line AA and line BB shown in FIG. 18.

The component was prepared by the following method:

A film of ink P is deposited on a substrate during step 1, and said film is consolidated;

in step 2, a film of ink M1 is deposited on either side of the film P in the form of two zones corresponding to the pads under the zones 1 and 2 of the piezoelectric component (shown in FIGS. 17a and 17b), and said film M1 is partially consolidated;

in step 3, a film of ink M'1 is deposited according to the pattern shown in FIG. 18 and representing the shape of the lower electrode, and a partial consolidation is carried out;

in step 4, a film of ink M2 is deposited according to the same pattern as the one used for the ink M'1, and a partial consolidation is carried out;

in step 5, a film of ink P' is deposited according to the pattern shown in FIG. 18 (this film of ink P' serves to electrically insulate the two electrodes M'1 and M"1) and said film is consolidated;

in step 6, a film of ink M"1 is deposited according to the patterns shown in FIG. 18 (this film must be contained in the pattern of the film M2 to avoid short-circuits between the electrodes M'1 and M"1) and representing the shape of the upper electrode, and a total consolidation is carried out;

in step 7, the material P is removed until its complete disappearance by total immersion of the sample in an aqueous solution of $H_3PO_4$ (1 mol/L).

The method was implemented using an aluminum substrate and the following inks:

Inks P,P ink containing 55% $SrCO_3$ and 45% epoxy resin (by weight);

Inks M1,M'1,M"1 gold-containing inks sold under the trade name Au8836 by ESL;

Ink M2 piezoelectric prepared in the laboratory containing 24% by weight of ESL400 organic binder supplied by ESL and 76% by weight of powder consisting of 96% by weight of $PbZr_{0.5}Ti0.5O_3$ (PZT50/50) and 4% by weight of PbO/$PbF_2$ eutectic.

Several piezoelectric components of different sizes were prepared by the above procedure.

For each of the preparations, the consolidation of the inks P and P' in the $1^{st}$ and $5^{th}$ step and the partial consolidation of steps 2, 3, and 4 were each effected at 125° C. for 25 min.

The total consolidation of step 6 was effected by a heat treatment of 3 hours comprising two temperature holds (10 min at 500° C. and 25 min at 920° C.), a temperature rise of 75 min, followed by a temperature lowering in 70 min.

The electrodes have a thickness of about 15 µm and an area of between 0.1 and 15 $mm^2$. The film of piezoelectric material has a thickness of about 80 µm and an area of between 0.1 and 15 $mm^2$.

Characterization of the Piezoelectric Component

The performance was evaluated of a suspended piezoelectric component obtained by the above method and which has the following dimensions: 3 mm×3 mm×0.08 mm. The piezoelectric component was polarized for 5 min at 210° C. under 150 V, and then cooled to 25° C. while maintaining the voltage of 150 V. The measurement of the conductance as a function of frequency revealed three resonance frequencies. The variation in conductance of the component as a function of frequency is shown in FIG. 21.

The invention claimed is:

1. A method for manufacturing a suspended piezoelectric microcomponent which comprises a lower electrode and an upper electrode, said method comprising:

1) depositing on an alumina substrate, a first temporary layer of an ink (P) formed by a thermosetting epoxy resin containing $SrCO_3$ as a mineral filler, and consolidating said layer;

2) depositing on both sides of the first temporary ink layer (P), a first gold ink layer (M1) in the form of two separate areas, and partially consolidating said layer (M1);

3) depositing a second gold ink layer (M'1) according to a pattern representing the shape of the lower electrode, only above the first temporary ink layer (P) and so that said second gold ink layer (M'1) touches only a first of said two areas forming the first gold ink layer (M1), and partially consolidating said layer (M'1);

4) depositing, only on the portion of the second gold ink layer (M'1) representing the lower electrode, a piezoelectric ink layer (M2), said piezoelectric layer containing an organic binder and a powder consisting of $PbZr_{0.5}Ti_{0.5}O_3$ and PbO/$PbF_2$ eutectic, and partially consolidating said layer (M2);

5) depositing a second temporary ink layer (P') formed by a thermosetting epoxy resin containing $SrCO_3$ as a mineral filler, in order to electrically insulate both electrodes, said second temporary ink layer being directly positioned on a free surface of the first temporary ink layer (P) between the second gold ink layer (M'1) and the second of said two areas forming the first gold ink layer (M1), and consolidating said layer (P');

6) depositing a third gold ink layer (M"1), said third layer being contained over a portion of the fourth ink layer (M2) so as to touch only the second of said two areas forming the first gold ink layer (M1), the third gold ink layer (M"1) representing the shape of the upper electrode, and carrying out total consolidation, said total consolidation being carried out by a heat treatment by baking between 500° C. and 1200° C.; and 7) totally removing the material of the two temporary ink layers (P, P') after said total consolidation, said total removal being carried out by immersion of the sample in water or acidic medium, wherein the inks (M1, M'1, M"1, M2, P and P') are deposited by screen printing, wherein the consolidation of ink layers P and P' are each carried out at a temperature between 120° C. and 220° C. for a period of 20 minutes to 2 hours, and wherein the partial consolidation of ink layers M1, M'1, and M2 are each carried out at a temperature of between 120° C. and 150° C. for a period of 10 minutes to 20 minutes.

2. The method according to claim 1, wherein the different deposited layers have a thickness ranging from 1 µm and 1 mm.

3. The method according to claim 1, wherein the organic binder of an ink M2 contains at least one temporary binder, at least one solvent, and optionally at least one compound selected from gelling agents, plasticizers, surfactants, and lubricants.

4. The method according to claim 1, wherein the partial consolidation of the ink layers M1, M'1 and M2 is carried out at a temperature of 125° C., for a duration of 25 mins.

* * * * *